United States Patent [19]

Murakoshi et al.

[11] Patent Number: 5,134,289
[45] Date of Patent: Jul. 28, 1992

[54] FIELD EMISSION ELECTRON DEVICE WHICH PRODUCES A CONSTANT BEAM CURRENT

[75] Inventors: Hisaya Murakoshi, Hachioji; Mikio Ichihashi, Kodaira; Shigeto Isakozawa; Yuji Sato, both of Katsuta, all of Japan

[73] Assignee: Hitachi, Ltd., Tokyo, Japan

[21] Appl. No.: 627,976

[22] Filed: Dec. 17, 1990

[30] Foreign Application Priority Data

Dec. 18, 1989 [JP] Japan ................................. 1-326134

[51] Int. Cl.⁵ ............................................. G01N 23/00
[52] U.S. Cl. ....................................... 250/311; 250/306
[58] Field of Search ............................ 250/306, 311; 313/363.1

[56] References Cited

U.S. PATENT DOCUMENTS 3,786,305 1/1974 Komoda et al. ...................... 315/30
3,936,756 2/1976 Someya et al. ...................... 250/311
4,642,461 2/1987 Endo et al. ........................... 250/311

FOREIGN PATENT DOCUMENTS 59-134539 8/1984 Japan.

Primary Examiner—Jack I. Berman
Assistant Examiner—James Beyer
Attorney, Agent, or Firm—Fay, Sharpe, Beall, Fagan, Minnich & McKee

[57] ABSTRACT

A field emission electron microscope in which a controller is provided to make an electron beam current fixed due to variations in an accelerating voltage or an extracting voltage to thereby make fixed the brightness of an electron beam with which a specimen is illuminated.

16 Claims, 4 Drawing Sheets

FIELD EMISSION ELECTRON DEVICE WHICH PRODUCES A CONSTANT BEAM CURRENT

BACKGROUND OF THE INVENTION

The present invention generally relates to a field emission electron microscope, particularly relates to quantitative analysis of the elemental composition of a specimen, and more particularly relates to control of an extracting voltage or an accelerating voltage to be applied to a source.

FIG. 4 shows an example of the conventional configuration of an illumination system of an electron microscope using a field emission source. A field emission current from a field emission source 1 is controlled on the basis of an extracting voltage $V_1$ applied to a first anode (extracting electrode) 3 in an electrostatic lens 2. A control voltage $V_2$ for controlling the lens action of the electrostatic lens 2 is applied to a second anode (the first accelerating electrode) 4. A resistor 9 is equally divided so that equal divisional voltages are applied across adjacent electrodes after the second anode 4. A control means for controlling the ratio of the control voltage $V_2$ for the electrostatic lens 2 to the extracting voltage $V_1$ to be a fixed value in response to a change of the extracting voltage $V_1$ is disclosed, for example, in JPA 60-117534. That is, the control voltage $V_2$ is controlled in response to a change of the extracting voltage $V_1$. In such a field emission electron microscope, there has been a problem in that when a specimen is illuminated with an electron beam and the characteristic X-rays are detected to thereby perform quantitative analysis of the elemental composition of the specimen, the beam fluctuates making it impossible to perform accurate analysis.

SUMMARY OF THE INVENTION

It is therefore an object of the present invention to provide a field emission electron microscope in which even when the extracting voltage $V_1$ or the accelerating voltage $V_0$ to be applied to the source is adjusted in any way, the beam current limited by an aperture becomes always fixed so that a specimen can be illuminated with an electron beam with fixed brightness.

An aperture 6 for limiting an electron beam current is disposed between the electrostatic lens 2 and the principal plane of a condenser lens 5 for focusing an image of the electrostatic lens 2 onto a surface of a specimen 7 or a predetermined point in the vicinity of the specimen. In this case, let the distance between the aperture 6 and the focal position of the electrostatic lens 2 be L, and let the exit half-angle of the electrostatic lens 2 limited by the aperture 6 having a diameter of $2\gamma$ be $\beta$. Then, the relation: $2\gamma = 2L\beta$ is established. Further, let the exit half-angle of the source corresponding to the exit half-angle $\beta$ of the electrostatic lens 2 be $\alpha$, then the exit half-angle of the source limited by the aperture 6 having a diameter of $2L\beta$ becomes $\alpha$. Therefore, let the angular intensity (an emission current per unit solid angle) of the field emission source 1 be $\omega$, then the beam current at the aperture 6 becomes $\pi\alpha^2\omega$. The angular intensity $\omega$ varies in accordance with the extracting voltage $V_1$. The extracting voltage $V_1$ for obtaining a desired value of the angular intensity $\omega$ varies depending on the emission source. Further, if the emission source is heated so as to clean the surface thereof, the radius of curvature of the source varies so that the relation between $\omega$ and $V_1$ also varies as time elapses. Thus, in order to maintain the angular intensity $\omega$ in a desired value, it is necessary to change the extracting voltage $V_1$. Since the lens action of the electrostatic lens 2 varies as the $V_1$ varies, in order to fix the beam current limited by the aperture 6, it is necessary to adjust the electrostatic lens action on the basis of the control voltage $V_2$.

In order to attain the foregoing object, according to the present invention, there is provided an applied voltage control means for changing the control voltage $V_2$ applied to the accelerating electrodes after the second anode (the first accelerating electrode) 4 in response to a change of the extracting voltage $V_1$ applied to the first anode (the extracting electrode) 3 or the accelerating voltage $V_0$ applied to the source 1 so that the ratio of $L\beta/\alpha$ is fixed.

The beam current at the aperture 6 having a diameter of $2\gamma = 2L\beta$ becomes $\pi\alpha^2\omega$ as described above. If $L\beta/\alpha$ is fixed, the exit half-angle $\alpha$ of the source 1 limited by the aperture 6 having a diameter of $2L\beta$ becomes fixed. Therefore, if the relation among $V_2$, $V_1$ and $V_0$ are properly controlled so that $\omega$ is kept to have a fixed value and the condition of $L\beta/\alpha = K$ (fixed value) is satisfied, the beam current at the aperture 6 is always fixed so that a specimen can be always illuminated with an electron beam with fixed brightness.

Referring to FIG. 2, a description will be made as to the specific operation for controlling the control voltage $V_2$. In the drawing, respective curved solid lines (a) and (b) represent relational curved lines between $V_2$ and $V_1$ in the case where $V_0 = 200$ kV and $V_0 = 100$ kV. In either case, the condition of $L\beta/\alpha = K_1$ (a certain fixed value) is satisfied while the field emission current is kept to be a predetermined value (30 $\mu$A in an embodiment described later). Those relational curved lines are obtained by calculating the electron orbit of the electrostatic lens or obtained experimentally as will be described later. That is, if the relation among $V_2$, $V_1$ and $V_0$ is on the curved solid line (a) or (b), such conditions that the field emission current is kept to be a fixed value and $L\beta/\alpha = K_1$ (= fixed value) are satisfied. This means that in any of the combinations of $(V_2 = A, V_1 = 4$ kV, and $V_0 = 200$ kV), $(V_2 = B, V_1 = 6$ kV, and $V_0 = 200$ kV) and $(V_2 = C, V_1 = 4$ kV, and $V_0 = 100$ kV), the field emission current is kept to be a fixed value and the $L\beta/\alpha$ is also kept to be a fixed value, and therefore the beam current at the aperture is always fixed for the foregoing reason. Accordingly, if the relation among $V_2$, $V_1$ and $V_0$ shown by the curved solid lines (a) and (b) is stored in a control section for generating a control command so that $V_2$ is controlled so as to come on the curved solid line (a) or (b) in response to a change of $V_1$ or $V_0$, the beam current at the aperture is fixed. As a result, the brightness of an electron beam with which a specimen is illuminated can be controlled so as to be fixed.

DETAILED DESCRIPTION OF THE PREFERRED EMBODIMENTS

Figure 1:
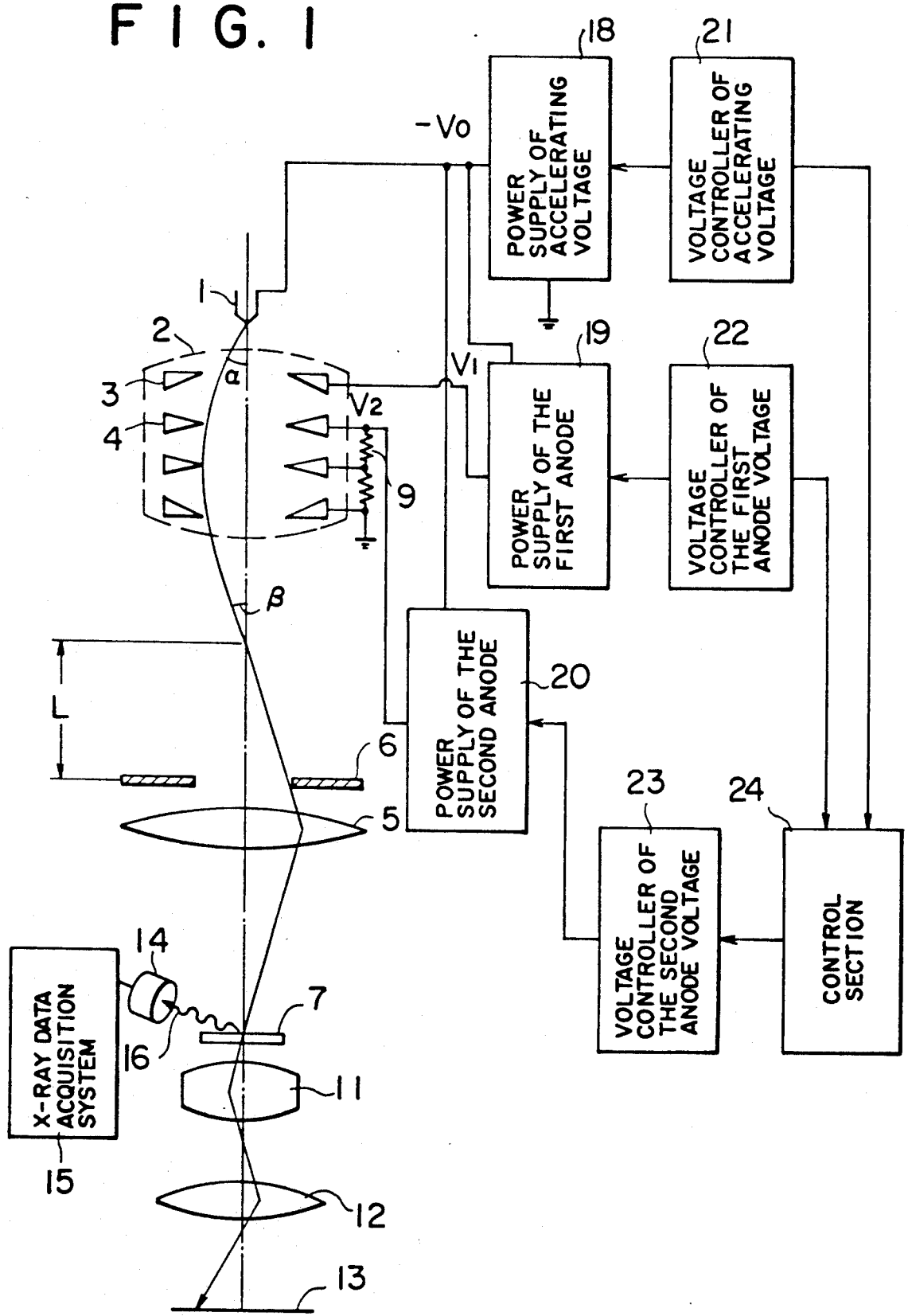
FIGS. 1 and 3 are diagrams showing the configurations of embodiments of the present invention.

Referring to FIG. 1 an embodiment of the present invention will be described hereunder.

In the configuration of FIG. 1, an X-ray detector is provided in a transmission electron microscope having a field emission source mounted thereon. An electron beam emitted from a field emission source 1 is accelerated by an electrostatic lens 2 so as to have a desired accelerating voltage, and the condition of illumination onto a specimen is adjusted by a condenser lens 5.

The electron beam transmitted through the specimen 7 is focused by an objective lens 11 and a projection lens 12 so that an image of the transmission electron microscope is formed on a fluorescent screen 13. Further, X-rays 16 generated by a mutual action with the beam in the specimen are detected by an X-ray detector 14, and a treated X-ray energy spectrum is displayed in an X-ray data acquisition system 15. The X-ray energy depends on the kind of elements constituting the specimen. Accordingly, if attention is paid to the X-ray count value of the energy corresponding to a certain element, quantitative analysis of the element can be performed. Since the X-ray count value depends on the electron beam current, it is necessary that the electron beam current is always fixed so as to perform quantitative analysis of the element. A description will be made hereunder as to means for controlling an electron beam current.

An aperture 6 for limiting a beam current is disposed on an optical axis between the electrostatic lens 2 and a principal plane of the condenser lens 5 for focusing an image of the electrostatic lens 2 onto a specimen 7 or a predetermined position in the specimen. In a control section 24, the values of the control voltage $V_2$ which satisfy the condition that the value of the $L\beta/\alpha$ is fixed with respect to the extracting voltage $V_1$ and the accelerating voltage $V_0$ are stored as data or given as a functional expression $V_2 = f(V_0, V_1)$. Although the relation among $V_2$, $V_0$ and $V_1$ is obtained by calculating the electron orbit of the electrostatic lens 2, such a value of $V_2$ which makes the beam current on a specimen fixed with respect to a combination of $V_0$ and $V_1$ may be experimentally obtained by measuring the beam current on the specimen. The respective values of $V_2$ which satisfy the relation $L\beta/\alpha = K_1$, for example, with respect to the combinations ($V_0 = 100$ kV, 200 kV; and $V_1 = 4$-7 kV) are stored in the control section 24 as the curved lines (a) and (b) shown in FIG. 2 or given as certain functions.

First, for example, in order to make the source accelerating voltage $V_0$ be 200 kV, the source accelerating voltage $V_0$ is applied from a power supply 18 for supplying the accelerating voltage through a controller 12 for controlling the accelerating voltage. Next, the extracting voltage $V_1$ is applied from a power supply 19 for supplying the first anode voltage through a controller 22 for controlling the first anode voltage till a field emission current flowing in a first anode 3 has reached, for example, 30 $\mu$A. Here, assuming that the field emission current has reached a desired value of 30 $\mu$A at $V_1 = 4$ kV, the field emission current is fixed to this value. The control section 24 reads the value (220 kV) of and the value (4 kV) of $V_1$ from the power supplies 21 and 22 respectively, calculates the value $V_2 = A$ which satisfies the relation $L\beta/\alpha = K_1$, and generates a command signal so that $V_2 = A$ is supplied as the control voltage $V_2$ from a power supply 20 for supplying the second anode voltage through a controller 23 for controlling the second anode voltage. If the value of $V_0$ is 6 kV for flowing the field emission current of the same value of 30 $\mu$A, the control section 24 calculates the value $V_2 = B$ which satisfies the relation $L\beta/\alpha = K_1$, and generates a command signal so that $V_2 = B$ is supplied as the control voltage $V_2$. By the foregoing operation, the beam current limited by the aperture 6 is automatically made to have the same value in both the cases where $V_1 = 4$ kV and $V_2 = 6$ kV. In the control system described above, the control voltage $V_2$ is controlled so as to vary in response to the extracting voltage $V_1$.

Alternatively, the control voltage $V_2$ may be controlled in response to the source accelerating voltage $V_0$ so that the operational condition of the illumination system is kept fixed. For example, when the value of the source accelerating voltage $V_0$ varied into 100 kV with extracting voltage $V_1$ fixed to 4 kV, the control section 24 generates a command signal so as to make the control voltage $V_2 = C$. As a result, the condition $L\beta/\alpha = K_1$ is satisfied and the beam current at the aperture 6 is fixed.

Figure 2:
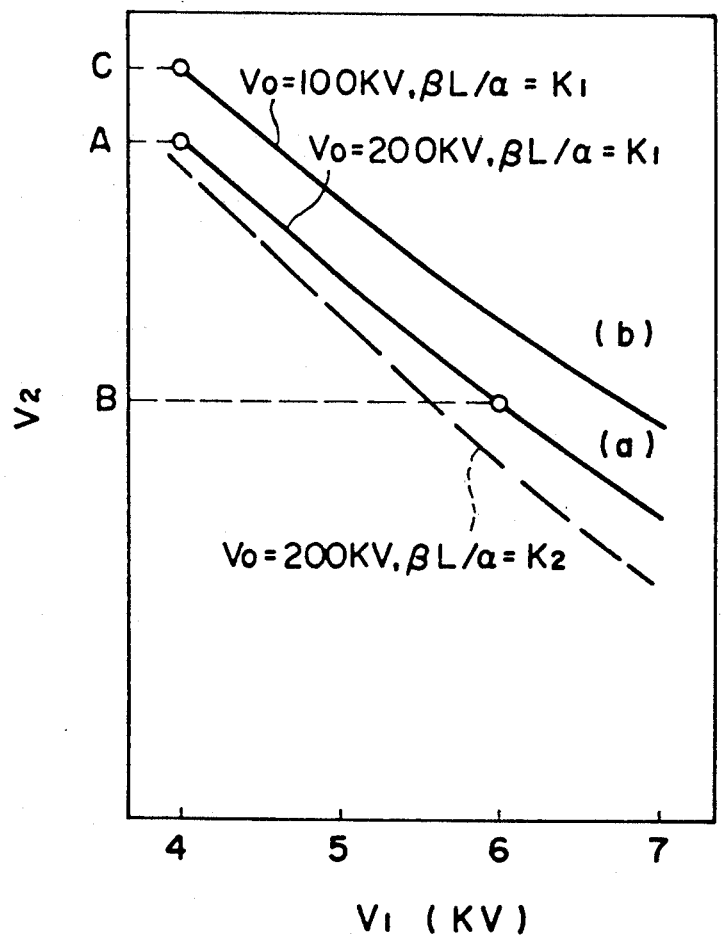
FIG. 2 is a diagram for explaining the control operation of the present invention, the diagram showing relation curved lines among $V_2$, $V_1$ and $V_0$ stored or operated in the control section.

Further, in FIG. 2, the control voltage $V_2$ corresponding to the value $L\beta/\alpha = K_2$ is illustrated as shown by a curved broken line. Thus, the control voltage $V_2$ can be set corresponding to each of a plurality of values of $L\beta/\alpha = K_2$, so that the beam current limited by the aperture 6 can be also controlled without changing the field emission current.

Figure 3:
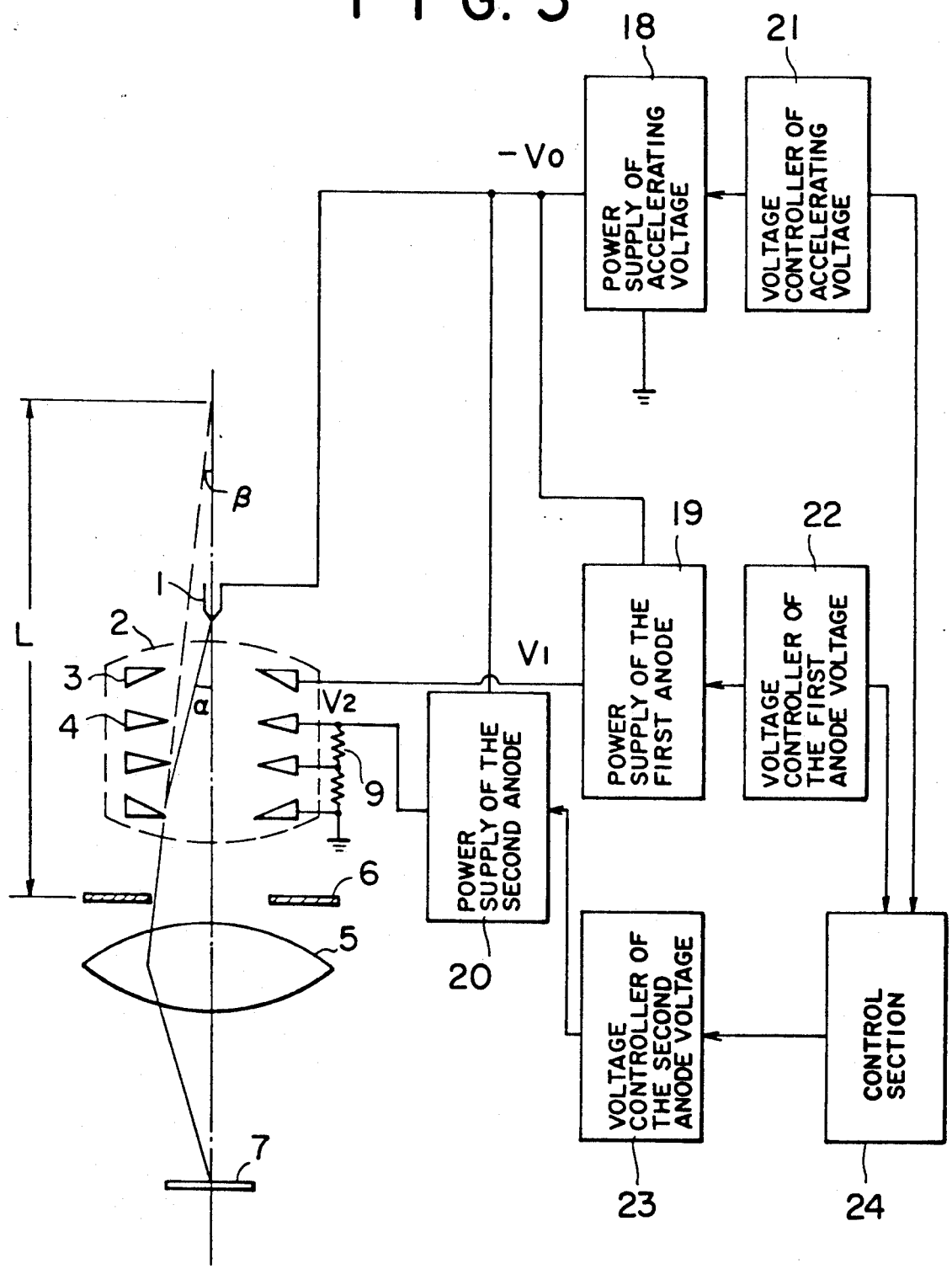
Figure 4:
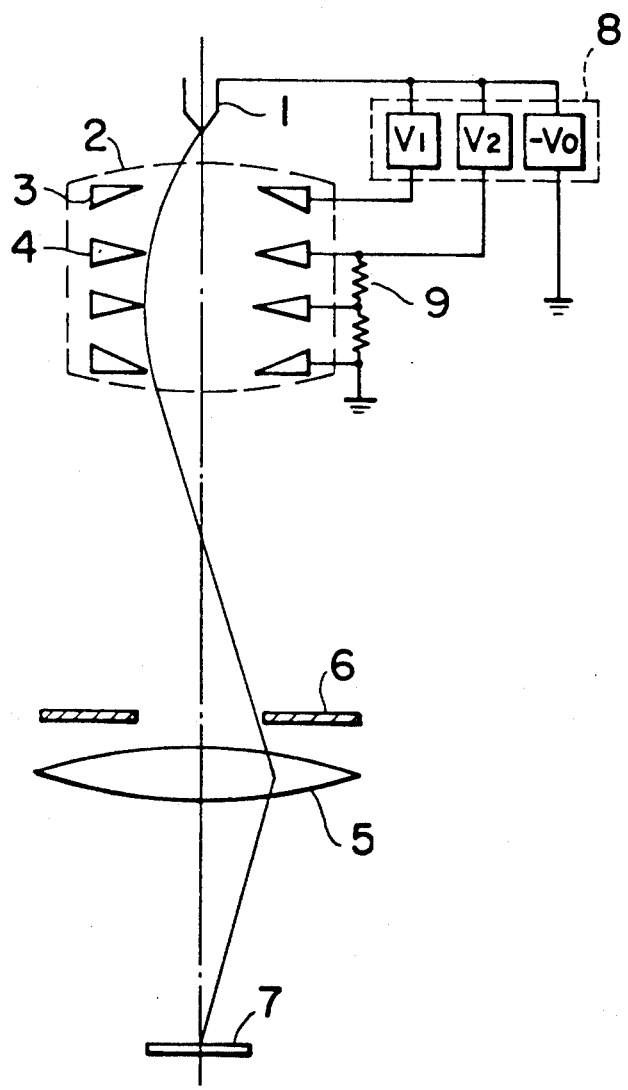
FIG. 4 is a diagram showing the configuration of a conventional example.

Although the drawings have been illustrated as to the case where the electrostatic lens focuses an image on the real image side thereof, in the case where the electrostatic lens forms an image on the virtual image side, the beam current limited by the aperture 6 can be kept fixed in the configuration shown in FIG. 3. That is, the aperture 6 for limiting the electron beam current is disposed between the electrostatic lens 2 and the principal plane of the condenser lens 5 in the succeeding stage of the electrostatic lens 2, and the control voltage $V_2$ is controlled in accordance with the extracting voltage $V_1$ or the source accelerating voltage $V_0$ so as to make fixed the product $L\beta/\alpha$ obtained by multiplying the distance L between the aperture and the focusing position of the electrostatic lens 2 on the virtual image side by the angle magnification $\beta/\alpha$ of the electrostatic lens 2 to thereby keep the beam current limited by the aperture fixed.

Although a description has been made as to a transmission electron microscope in the foregoing embodiments, the beam current control means according to the present invention can be applied also to a scanning electron microscope, a scanning transmission electron microscope, an electron beam lithography system, and the like in which a field emission source is mounted, a deflection coil is disposed between the source and a specimen, and an electron beam deflection means is provided.

As described above, according to the present invention, the aperture for limiting an electron beam current is disposed between the electrostatic lens and the principal plane of the condenser lens in the succeeding stage of the electrostatic lens, and the control voltage $V_2$ is controlled in response to a change of the extracting voltage $V_1$ or the source accelerating voltage $V_0$ so as to make fixed the product $L\beta/\alpha$ obtained by multiplying the distance L between the aperture and the focusing position of the electrostatic lens by the angle magnification $\beta/\alpha$ of the electrostatic lens. Accordingly, the beam current limited by the aperture is always fixed and a specimen can be always illuminated with an electron beam with fixed brightness even if $V_1$ or $V_2$ varies in any way.

What is claimed is:

1. A field emission electron device, comprising:
   a field emission source;
   an electronic optical means for illuminating a specimen with an electron beam emitted from said field emission source and having at least a first stage and a last stage, each for changing the trajectory o the electron beam; and
   means for controlling a voltage applied to the electronic optical means according to a condition of the electron beam at the last stage of the electronic optical means.

2. A field emission electron device according to claim 1, in which said electronic optical means includes:
   an electrostatic lens having an extracting electrode in the first stage for causing said field emission source to field-emit an electron beam therefrom, and having an accelerating electrode of at least two stages including the last stage for accelerating said electron beam;
   a focusing lens for focusing an image of said electrostatic lens onto a specimen or a predetermined position in the vicinity of said specimen; and
   an aperture disposed between said electrostatic lens and said focusing lens for limiting a beam current.

3. A field emission electron device according to claim 2, wherein said means for controlling a voltage applies a control voltage to said acceleration electrode so as to make the value of $L\beta/\alpha$ fixed, where L, $\alpha$ and $\beta$ represent a distance between a focal position of said electrostatic lens and an aperture surface, an exit half-angle of said source, and an exit half-angle of said electrostatic lens, respectively.

4. A method for controlling a field emission electron beam, comprising the steps of:
   emitting an electron beam from a field emission source;
   controlling an optical system for the electron beam, wherein the electron beam is controlled by referring to a condition of the electron beam at a last stage of the optical system, the trajectory of the electron beam being determined under predetermined conditions in advance, so that a predetermined current of the electron beam is obtained; and
   illuminating a specimen with the controlled electron beam.

5. A method for controlling a field emission electron beam according to claim 4, wherein the trajectory of the electron beam is determined under the condition of $L\beta/\alpha$ being a constant, wherein L, $\beta$ and $\alpha$ represent a distance between a focal position of a electrostatic lens and an aperture surface, an exit half-angle of the electrostatic lens and an exit half-angle of the source, respectively.

6. A method for controlling a field emission electron beam comprising the steps of:
   emitting the electron beam from a field emission source by applying an accelerating voltage $V_0$ to the field emission source;
   applying an extracting voltage $V_1$ to a first stage of an electrostatic lens;
   first controlling an angular intensity w of the emitted electron beam to be constant by adjusting at least one of $V_0$ and $V_1$;
   second controlling the beam to have a constant current by adjusting $V_2$, a control voltage applied to accelerating electrodes in a second stage of the electrostatic lens, in response to the values of both $V_0$ and $V_1$;
   limiting the current o the electron beam after the electrostatic lens by an aperture; and
   wherein said second controlling uses a condition of the electron beam to adjust $V_2$ and is under the condition of $L\beta/\alpha$ being a constant, wherein L, $\beta$ and $\alpha$ represent a distance between a focal position of the electrostatic lens and the aperture, an exit half-angle of the electrostatic lens and an exit half-angle of the source, respectively.

7. A method for controlling a field emission electron beam comprising the steps of:
   emitting the electron beam from a field emission source by applying an accelerating voltage $V_0$ to the field emission source;
   applying an extracting voltage $V_1$ to a first stage of an electrostatic lens;
   first controlling an angular intensity w of the emitted electron beam to be constant by adjusting at least one of $V_0$ and $V_1$;
   second controlling the beam to have a constant current by adjusting $V_2$, a control voltage applied to accelerating electrodes in a second state of the electrostatic lens, in response to the values of both $V_0$ and $V_1$; and
   wherein said second controlling uses a different relationship between $V_1$ and $V_2$ for each different value of $V_0$.

8. A method for controlling a field emission electron beam according to claim 7, wherein the relationship between $V_1$ and $V_2$ is a non-linear relationship for each different value of $V_0$.

9. A method for controlling a field emission electron beam according to claim 8, further comprising the step of limiting the current of the electron beam after the electrostatic lens by an aperture; and
   wherein said second controlling is under the condition of $L\beta/\alpha$ being a constant, the constant which $L\beta/\alpha$ is equal to also determining the value of $V_2$, wherein L, $\beta$ and $\alpha$ represents a distance between a focal position of the electrostatic lens and the aperture, an exit half-angle of the electrostatic lens and an exit half-angle of the source, respectively.

10. A method for controlling a field emission electron beam, comprising the steps of:
    emitting an electron beam from a field emission source by applying a voltage $V_0$ to the field emission source;
    controlling the electron beam to have a constant current by passing the electron beam through an electrostatic lens and by controlling a control voltage $V_2$ applied to a second stage of the electrostatic lens, with $V_2$ being determined as a function of both the values of $V_0$ and $V_1$, with $V_1$ being an extracting voltage applied to a first stage of the electrostatic lens;
    limiting the current of the beam after the electrostatic lens by an aperture; and
    wherein said controlling is under the condition of $L\beta/\alpha$ being a constant, wherein L, $\beta$, and $\alpha$ represent a distance between a focal position of the electrostatic lens and the aperture, an exit half-angle of the electrostatic lens and an exit half-angle of the field emission source, respectively.

11. A method for controlling a field emission electron beam comprising the steps of:
   emitting an electron beam from a field emission source by applying a voltage $V_0$ to the field emission source;
   controlling the electron beam to have a constant current by passing the electron beam through an electrostatic lens and by controlling a control voltage $V_2$ applied to a second stage of the electrostatic lens, with $V_2$ being determined as a function of both the values of $V_0$ and $V_1$, with $V_1$ being an extracting voltage applied to a first stage of the electrostatic lens; and
   wherein said controlling uses a different relationship between $V_1$ and $V_2$ for each different value of $V_0$.

12. A method for controlling a field emission electron beam according to claim 11, wherein the relationship between $V_1$ and $V_2$ is a non-linear relationship for each different value of $V_0$.

13. A method for controlling a field emission electron beam according to claim 12, further comprising the step of limiting the current of the electron beam after the electrostatic lens by an aperture; and
   wherein said controlling is under the condition of $L\beta/\alpha$ being a constant, the constant which $L\beta/\alpha$ is equal to also determining the value of $V_2$, wherein L, $\beta$ and $\alpha$ represent a distance between a focal position of an electrostatic lens and the aperture, an exit half-angle of the electrostatic lens and an exit half-angle of the source, respectively.

14. A method for controlling a field emission electron beam, comprising the steps:
   emitting an electron beam from a field emission source by applying a voltage $V_0$ to the field emission source;
   controlling the electron beam to have a constant current by passing the electron beam through an electrostatic lens and by controlling a control voltage $V_2$ applied to a second stage of the electrostatic lens, with $V_2$ being determined as a non-linear function of $V_1$, with $V_1$ being an extracting voltage applied to a first stage of the electrostatic lens;
   wherein said controlling uses a different relationship between $V_1$ and $V_2$ for each different value of $V_0$.

15. A method for controlling a field emission electron beam according to claim 14, further comprising the step of limiting the current of the beam after the electrostatic lens by an aperture.

16. A method for controlling a field emission electron beam according to claim 15, wherein said controlling is dependent upon a condition of the electron beam that $L\beta/\alpha$ equals constant, wherein L, $\beta$ and $\alpha$ represent a distance between a focal position of the electrostatic lens and the aperture, an exit half-angle of the electrostatic lens and an exit half-angle of the field emission source, respectively.

* * * * *